United States Patent
Lin

(10) Patent No.: US 11,004,505 B1
(45) Date of Patent: May 11, 2021

(54) METHOD FOR OPERATING A NON-VOLATILE MEMORY CELL

(71) Applicant: eMemory Technology Inc., Hsin-Chu (TW)

(72) Inventor: Yih-Lang Lin, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 17/134,471

(22) Filed: Dec. 27, 2020

Related U.S. Application Data

(62) Division of application No. 16/658,179, filed on Oct. 21, 2019, now Pat. No. 10,916,302.
(Continued)

(51) Int. Cl.
| | |
|---|---|
| *G11C 11/34* | (2006.01) |
| *G11C 11/56* | (2006.01) |
| *H01L 27/11524* | (2017.01) |
| *G11C 16/30* | (2006.01) |
| *G11C 16/24* | (2006.01) |

(Continued)

(52) U.S. Cl.
CPC .......... *G11C 11/5642* (2013.01); *G05F 3/22* (2013.01); *G05F 3/30* (2013.01); *G11C 5/147* (2013.01); *G11C 16/0408* (2013.01); *G11C 16/0433* (2013.01); *G11C 16/08* (2013.01); *G11C 16/10* (2013.01); *G11C 16/14* (2013.01); *G11C 16/24* (2013.01); *G11C 16/26* (2013.01); *G11C 16/28* (2013.01); *G11C 16/30* (2013.01); *G11C 16/3445* (2013.01); *G11C 16/3459* (2013.01); *H01L 27/0207* (2013.01); *H01L 27/11524* (2013.01)

(58) Field of Classification Search
CPC .. G05F 3/22; G05F 3/30; G11C 5/147; G11C 16/24; G11C 16/10; G11C 16/14; G11C 16/3459; G11C 16/3445; G11C 16/30; G11C 16/08; G11C 16/0433; G11C 16/0408; G11C 11/5642; G11C 16/26; H01L 27/11524; H01L 27/0207
See application file for complete search history.

(56) References Cited

U.S. PATENT DOCUMENTS 6,330,186 B2 * 12/2001 Tanaka ................. G11C 16/10
365/185.11
7,176,751 B2  2/2007 Giduturi
(Continued)

FOREIGN PATENT DOCUMENTS

TW        I484493 B      5/2015

*Primary Examiner* — Uyen Smet
(74) *Attorney, Agent, or Firm* — Winston Hsu

(57) ABSTRACT

A non-volatile memory cell includes a floating gate transistor having a floating gate. A method for operating the non-volatile memory cell includes, during a program operation, performing an initial program searching operation to identify a first initial value of a threshold voltage of the floating gate transistor, coupling the floating gate of the floating gate transistor to a first program voltage to raise the threshold voltage of the floating gate transistor, performing a program searching operation to identify a first variation of the threshold voltage, generating a second program voltage according to the first variation of the threshold voltage, and coupling the floating gate of the floating gate transistor to the second program voltage to raise the threshold voltage of the floating gate transistor.

14 Claims, 8 Drawing Sheets

Related U.S. Application Data

(60) Provisional application No. 62/768,099, filed on Nov. 16, 2018.

(51) Int. Cl.
| | |
|---|---|
| *G11C 16/28* | (2006.01) |
| *G11C 16/08* | (2006.01) |
| *G11C 16/04* | (2006.01) |
| *G11C 16/10* | (2006.01) |
| *G11C 16/26* | (2006.01) |
| *G11C 16/34* | (2006.01) |
| *G05F 3/30* | (2006.01) |
| *G05F 3/22* | (2006.01) |
| *G11C 16/14* | (2006.01) |
| *H01L 27/02* | (2006.01) |
| *G11C 5/14* | (2006.01) |

(56) References Cited

U.S. PATENT DOCUMENTS

| | | |
|---|---|---|
| 7,428,172 B2 | 9/2008 | Choy |
| 8,432,733 B2 | 4/2013 | Higashitani |
| 9,548,124 B1 | 1/2017 | Hazeghi |
| 2008/0158986 A1 | 7/2008 | Elmhurst |
| 2013/0208543 A1 | 8/2013 | Park |
| 2017/0256320 A1 | 9/2017 | Lang |
| 2018/0053555 A1 | 2/2018 | Wong |
| 2018/0294278 A1 | 10/2018 | Yu |
| 2019/0333591 A1* | 10/2019 | Chen .................. G11C 16/3459 |

\* cited by examiner

METHOD FOR OPERATING A NON-VOLATILE MEMORY CELL

CROSS REFERENCE TO RELATED APPLICATIONS

The present application is a division of application Ser. No. 16/658,179 filed Oct. 21, 2019, entitled "METHOD FOR OPERATING A NON-VOLATILE MEMORY CELL," currently pending, which claims the benefit of provisional application No. 62/768,099 filed Nov. 16, 2018."

BACKGROUND OF THE INVENTION

1. Field of the Invention

The present invention is related to a method for operating a non-volatile memory cell, and more particularly, to a method for operating a non-volatile memory cell with threshold voltage searching.

2. Description of the Prior Art

An electrically rewritable non-volatile memory is a type of memory that retains information it stores even when no power is supplied to memory blocks and allows on-board rewriting of a program. Due to the wide range of applications for various uses, there is a growing need for a non-volatile memory to be embedded in the same chip with the main circuit, especially for personal electronic devices having strict requirement for circuit area.

For example, a rewritable non-volatile memory cell may include a floating gate transistor having a floating gate. In this case, by applying a program voltage on the floating gate, the FN (Fowler Nordheim) tunneling effect may be caused so the floating gate will capture the electrons under the floating gate. Consequently, the threshold voltage of the floating gate transistor will be raised, and the threshold voltage can be used to distinguish the programming state of the floating gate transistor.

However, due to the characteristic variation between different non-volatile memory cells, the suitable voltages capable of causing FN tunneling for different non-volatile memory cells may also be different. The program voltage suitable for one non-volatile memory cell may be inefficient for another non-volatile memory cell, making the voltage setting difficult.

SUMMARY OF THE INVENTION

One embodiment of the present invention discloses a method for operating a non-volatile memory cell. The non-volatile memory cell includes a floating gate transistor having a floating gate.

The method includes, during a program operation, performing an initial program searching operation to identify a first initial value of a threshold voltage of the floating gate transistor, coupling the floating gate of the floating gate transistor to a first program voltage to raise the threshold voltage of the floating gate transistor, performing a program searching operation to identify a first variation of the threshold voltage, generating a second program voltage according to the first variation of the threshold voltage, and coupling the floating gate of the floating gate transistor to the second program voltage to raise the threshold voltage of the floating gate transistor.

Another embodiment of the present invention discloses a method for operating a non-volatile memory cell. The non-volatile memory cell includes a floating gate transistor, a control element, and an erase element. The floating gate transistor has a floating gate. The control element has a first terminal coupled to the floating gate of the floating gate transistor, and a second terminal coupled to a control line. The erase element has a first terminal coupled to the floating gate of the floating gate transistor, and a second terminal coupled to an erase line.

The method includes, during an erase operation, performing an initial erase searching operation to identify an initial value of the threshold voltage of the floating gate transistor, applying a first erase voltage to the erase line to lower the threshold voltage of the floating gate transistor, performing an erase searching operation to identify a variation of the threshold voltage, generating a second erase voltage according to the variation of the threshold voltage, and applying the second erase voltage to the erase line to lower the threshold voltage of the floating gate transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
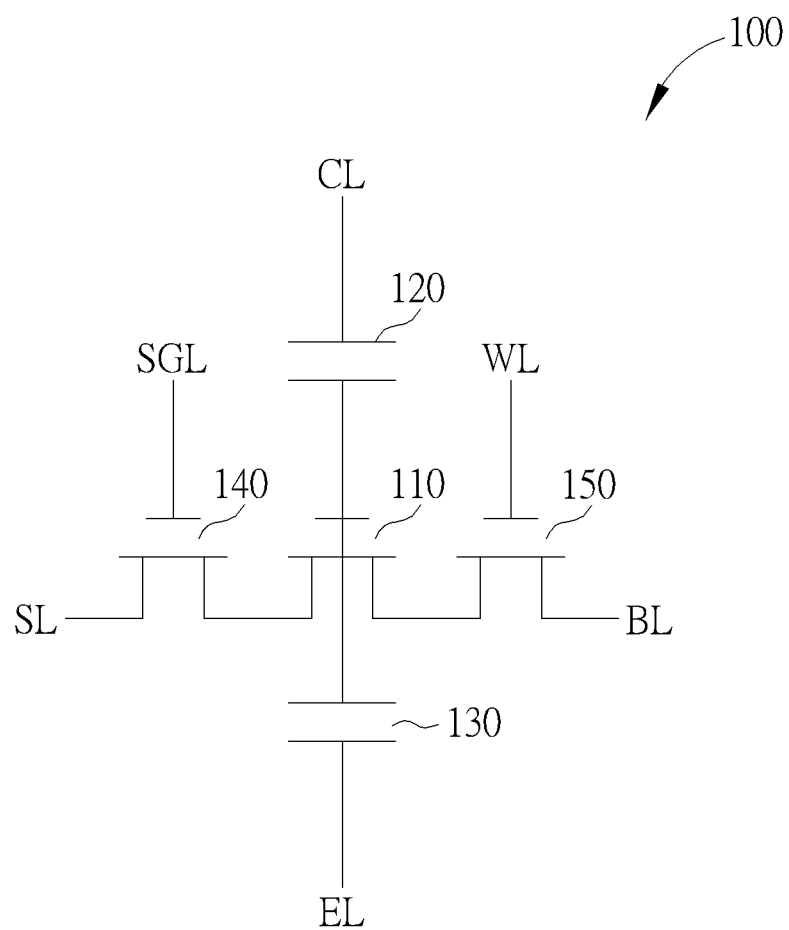
FIG. 1 shows a non-volatile memory cell according to one embodiment of the present invention.

FIG. 1 shows a non-volatile memory cell 100 according to one embodiment of the present invention. The non-volatile memory cell 100 includes a floating gate transistor 110, a control element 120, an erase element 130, a select transistor 140 and a word transistor 150.

The floating gate transistor 110 has a first terminal, a second terminal, and a floating gate. The control element 120 has a first terminal coupled to the floating gate of the floating gate transistor 110, and a second terminal coupled to a control line CL. The erase element 130 has a first terminal coupled to the floating gate of the floating gate transistor 110, and a second terminal coupled to an erase line EL. The select transistor 140 has a first terminal coupled to a source line SL, a second terminal coupled to a first terminal of the floating gate transistor 110, and a control terminal coupled to a select gate line SGL. The word transistor 150 has a first terminal coupled to a bit line BL, a second terminal coupled to a second terminal of the floating gate transistor 110, and a control terminal coupled to a word line WL.

In some embodiments, the control element 120 and the erase element 130 can be implemented by metal-oxide-semiconductor capacitors. In this case, the first terminals of the control element 120 and the erase element 130 can be gate terminals and the second terminals of the control element 120 and the erase element 130 can be body terminals. Thus, the first terminal of the control element 120, the first terminal of the erase element 130 and the floating gate of the floating gate transistor 110 can be coupled with the same polysilicon layer.

Furthermore, in some embodiments, the area of the polysilicon layer on the control element 120 can be much greater than the area of the floating gate on the floating gate transistor 110. Also, the area of the polysilicon layer of the erase element 130 can be greater than the area of the floating gate of the floating gate transistor 110, but would be smaller than the area of the polysilicon layer of the control element 120. Therefore, the voltage of the floating gate can be dominated by the voltage applied to the control terminal 120.

In some embodiments, before the non-volatile memory cell 100 is programmed, the threshold voltage of the floating gate transistor 110 can be rather low, for example, can be 0V. In this case, the floating gate transistor 110 can be easily turned on by coupling the floating gate to a low voltage applied through the control line CL and the erase line EL.

Also, the non-volatile memory cell 100 can be programmed by inducing FN tunneling on the floating gate of the floating gate transistor 110. For example, during the program operation, a rather high voltage can be applied to the control line CL, and the floating gate will be coupled to a high voltage through the control element 120. In some embodiments, the erase line EL may also receive the high voltage to further ensure the floating gate to be coupled to the high voltage. If the high voltage is set properly, the FN tunneling effect will be induced on the floating gate, and electrons will be trapped in the floating gate, raising the threshold voltage. In some embodiments, when the threshold voltage of the floating gate transistor 110 is raised to be higher than a predetermined level, the non-volatile memory cell 100 will be determined to be programmed.

However, to set up the proper program voltage to induce FN tunneling can be tricky. If the program voltage is not high enough, the FN tunneling effect may not be induced or may be insignificant, wasting the power. However, if the program voltage is set too high, the floating gate transistor 110 may be damaged by the high voltage stress. In some embodiments, the program voltage can be determined according to the programming conditions adaptively during the whole program operation.

Figure 2:
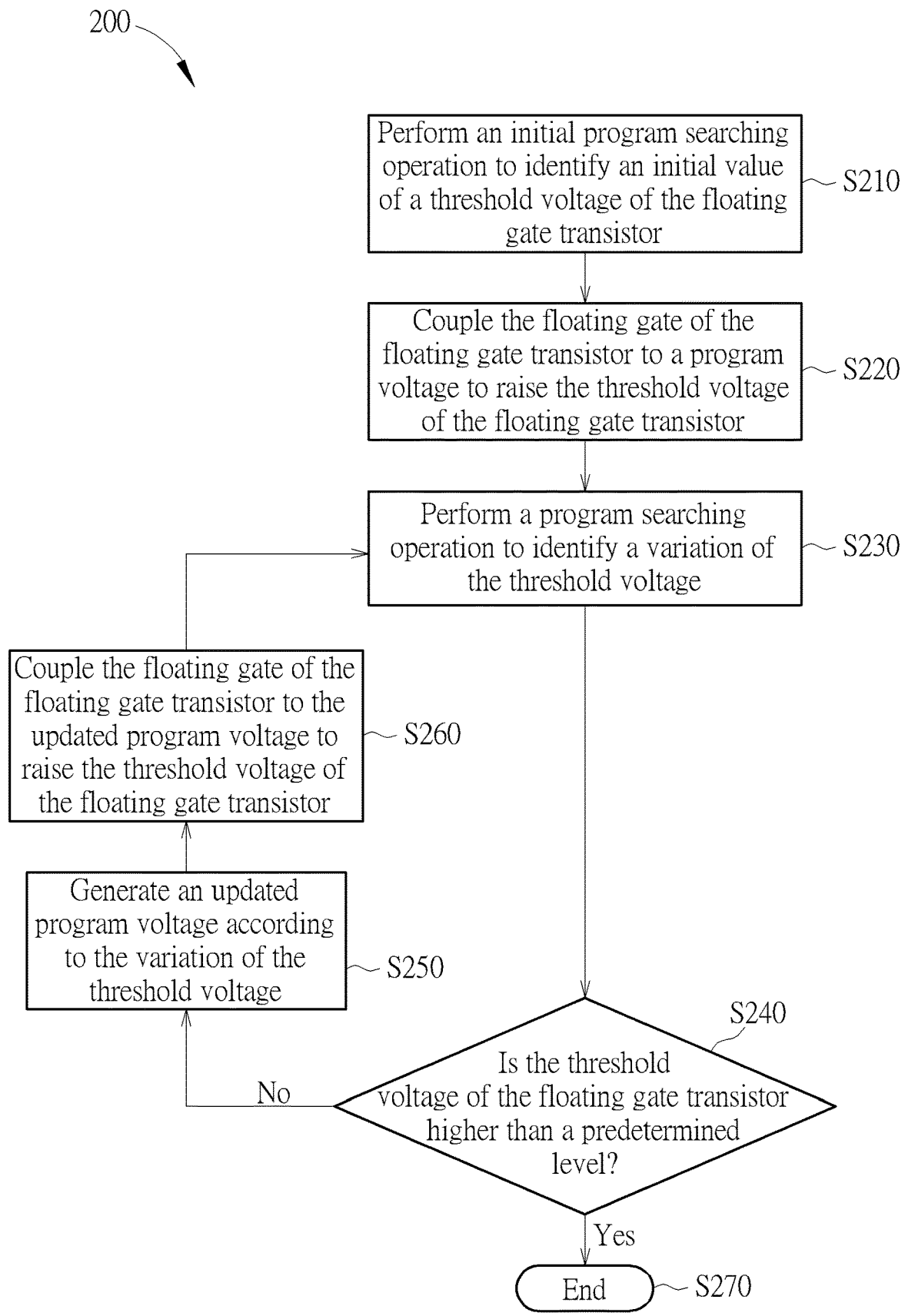
FIG. 2 shows a method for operating the non-volatile memory cell in FIG. 1 according to one embodiment of the present invention.
Figure 3:
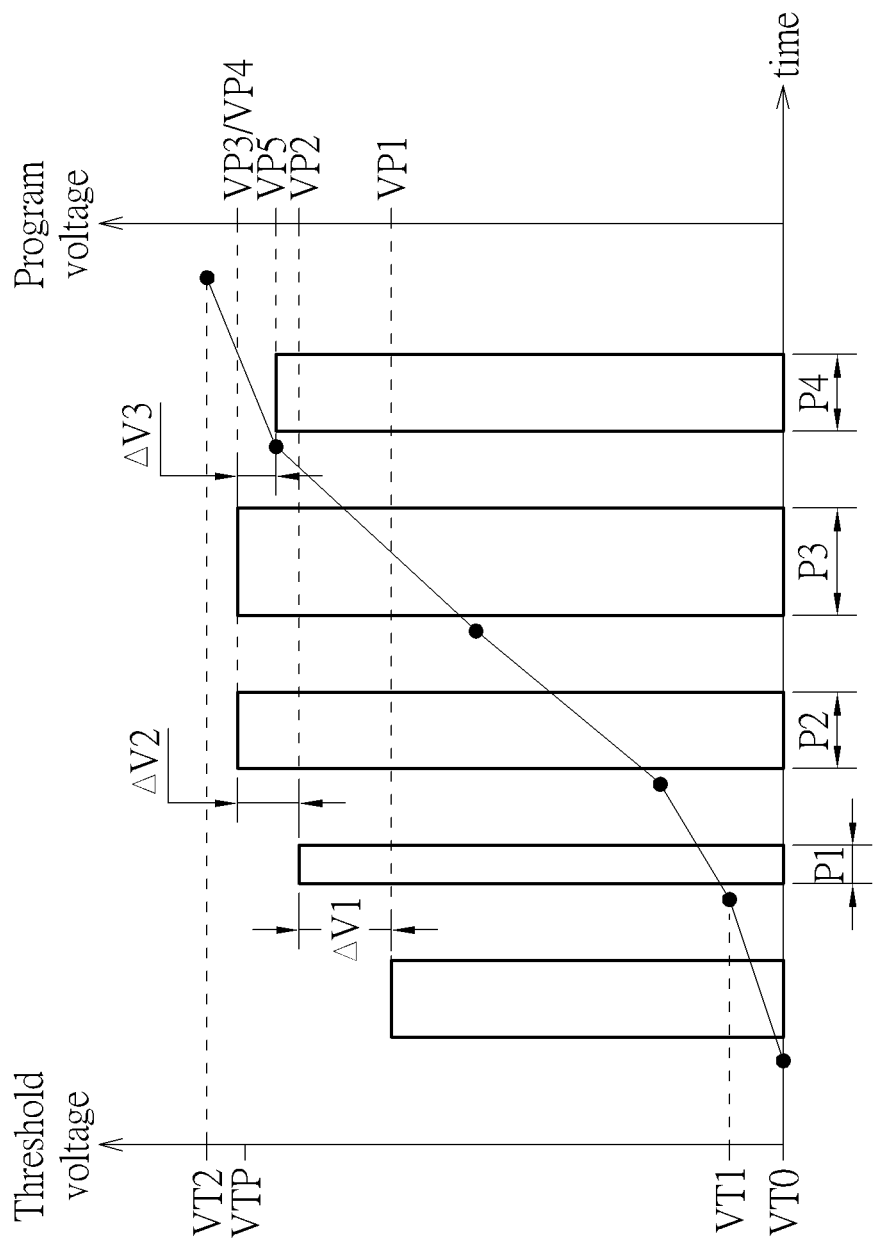
FIG. 3 shows the voltages applied to the non-volatile memory cell in FIG. 1 according to the method in FIG. 2.

FIG. 2 shows a method 200 for operating the non-volatile memory cell 100 according to one embodiment of the present invention. FIG. 3 shows the voltages applied to the non-volatile memory cell according to the method 200 in one embodiment. The method 200 can be used for performing the program operation. The method 200 includes steps S210 to S270.

S210: perform an initial program searching operation to identify an initial value of a threshold voltage of the floating gate transistor 110;

S220: couple the floating gate of the floating gate transistor 110 to a program voltage to raise the threshold voltage of the floating gate transistor 110;

S230: perform a program searching operation to identify a variation of the threshold voltage;

S240: if the threshold voltage of the floating gate transistor 110 is higher than a predetermined level, go to step S270, else go to step S250;

S250: generate an updated program voltage according to the variation of the threshold voltage;

S260: couple the floating gate of the floating gate transistor 110 to the updated program voltage to raise the threshold voltage of the floating gate transistor 110, go to step S230; and S270: End.

In step S210, the initial program searching operation can be performed to identify the initial value VT0 of a threshold voltage of the floating gate transistor 110 as shown in FIG. 3.

Figure 4:
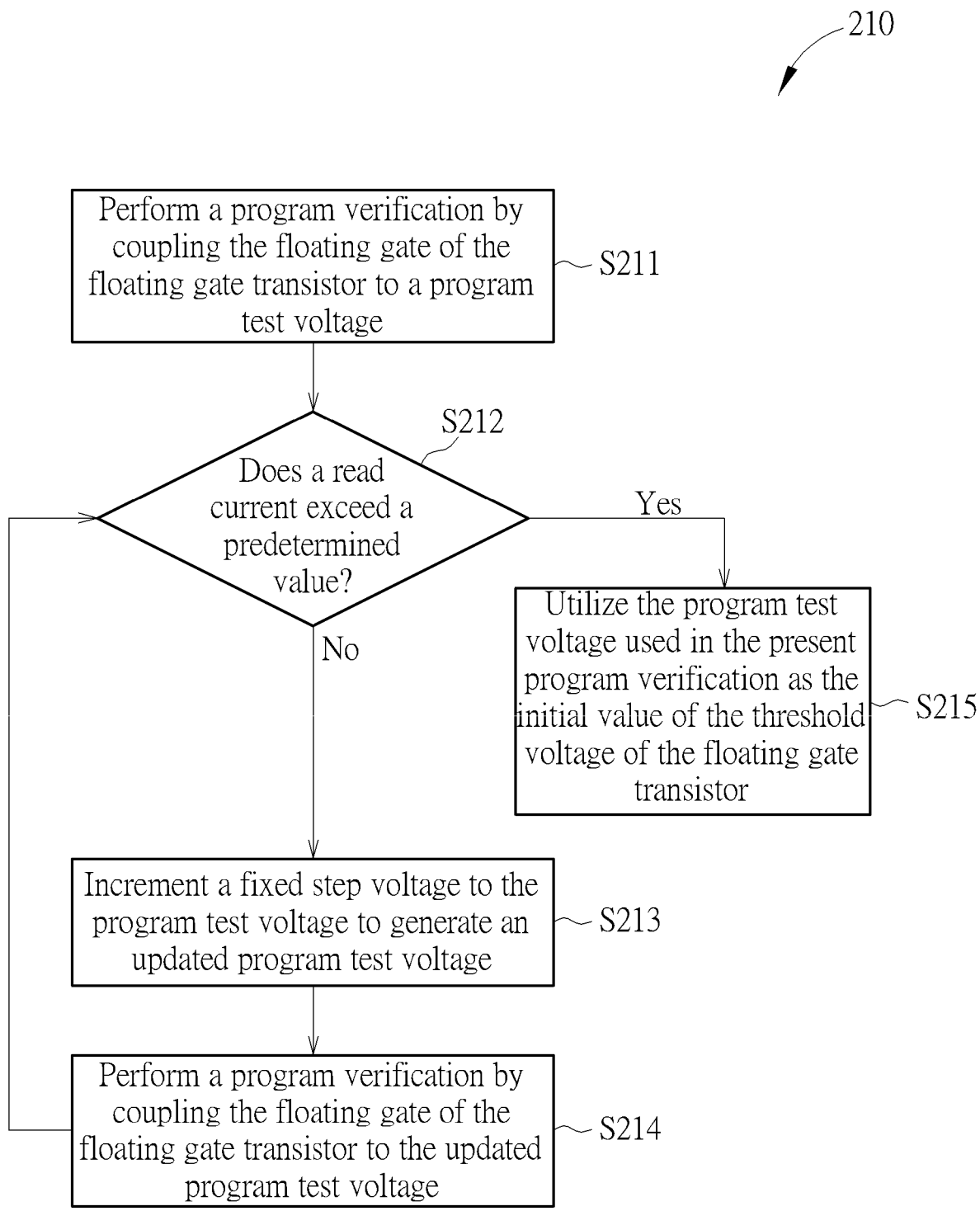
FIG. 4 shows the sub-steps of the initial program searching operation according to one embodiment of the present invention.

FIG. 4 shows sub-steps S211 to S215 of step S210 according to one embodiment of the present invention.

S211: perform a program verification by coupling the floating gate of the floating gate transistor 110 to a program test voltage;

S212: if a read current exceeds a predetermined value, go to sub-step S215, else go to sub-step S213;

S213: increment a fixed step voltage to the program test voltage to generate an updated program test voltage;

S214: perform a program verification by coupling the floating gate of the floating gate transistor 110 to the updated program test voltage, go to sub-step S212; and S215: utilize the program test voltage used in the present program verification as the initial value VT0 of the threshold voltage of the floating gate transistor 110.

In sub-step S211, during the program verification, an initial program test voltage can be applied to the floating gate of the floating gate transistor 110, and the select transistor 140 and the word transistor 150 can be turned on. Also, the source line SL can be at a voltage slightly greater than the voltage at the bit line BL. Therefore, if the program test voltage is higher than the threshold voltage of the floating gate transistor 110, then the floating gate transistor 110 will be turned on, and a significant reading current will be sensed from the bit line BL.

However, if the program test voltage is lower than the threshold voltage of the floating gate transistor 110, then the floating gate transistor 110 will be turned off, and no reading current or only an insignificant reading current will be sensed from the bit line BL. In this case, the program test voltage will be updated by adding the fixed step voltage in sub-step S213. The fixed step voltage can be, for example, but not limited to 0.1V. The updated program test voltage will be applied in the next program verification in sub-step S214, and the read current will be checked again in sub-step S212.

Consequently, the program test voltage will be increased gradually until the reading current exceeds the predetermined value, for example but not limited to 60/IA, and the smallest program test voltage that is able to turn on the floating gate transistor 110 during the initial program searching operation can be recorded as the initial value of the threshold voltage of the floating gate transistor 110.

In some embodiments, the initial program test voltage used in sub-step S211 can be set to a rather low voltage so that the initial value of the threshold voltage found by the initial program searching operation can be more accurate. Also, in some other embodiments, the initial program searching operation may be performed with other steps according to the system requirement.

After step S210, the first program voltage VP1 can be applied to the control line CL so the floating gate of the floating gate transistor 110 can be coupled to the first program voltage VP1 through the control element 120. In some embodiments, the first program voltage VP1 can be predetermined, for example but not limited to 8V. The high voltage coupled to the floating gate may induce the FN tunneling in step S220. Therefore, the threshold voltage of the floating gate transistor 110 may be raised.

In step S230, the threshold voltage of the floating gate transistor 110 can be detected, and the variation of the threshold voltage can be recorded.

Figure 5:
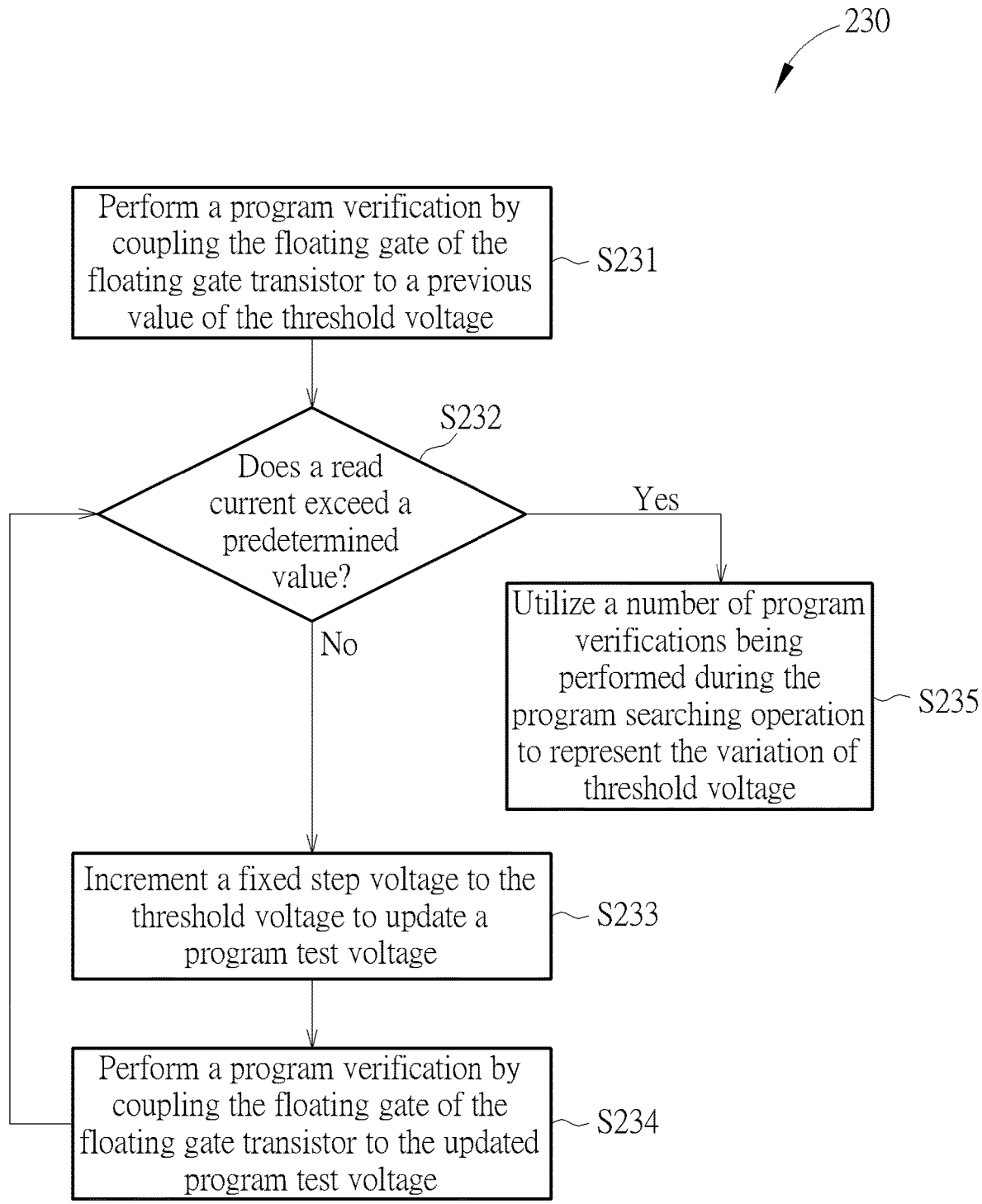
FIG. 5 shows the sub-steps of the program searching operation according to one embodiment of the present invention.

FIG. 5 shows sub-steps S231 to S235 of step S230 according to one embodiment of the present invention.

S231: perform a program verification by coupling the floating gate of the floating gate transistor 110 to a previous value of the threshold voltage;

S232: if a read current exceeds a predetermined value, go to sub-step S235, else go to sub-step S233;

S233: increment a fixed step voltage to the threshold voltage to update a program test voltage;

S234: perform a program verification by coupling the floating gate of the floating gate transistor 110 to the updated program test voltage, go to sub-step S232;

S235: utilize a number of program verifications being performed during the program searching operation to represent the variation of threshold voltage.

The program searching operation shown in FIG. 5 has similar principles as the initial program searching operation shown in FIG. 4. However, when performing the program searching operation, instead of coupling the floating gate of the floating gate transistor 110 to the program test voltage in sub-step S211, the floating gate of the floating gate transistor 110 is coupled to a previous value of the threshold voltage during the program verification in sub-step S231. For example, if the program searching operation is performed right after step S220, then the previous value of the threshold voltage would be the initial value VT0 obtained in step S210. Therefore, the program searching operation will start with the initial value VT0.

Since the threshold voltage of the floating gate transistor 110 may have been raised during step S220, the initial value VT0 of the threshold voltage may not be able to turn on the floating gate transistor 110. In this case, the reading current would be insignificant, and a greater program test voltage should be used in the next program verification.

Consequently, as the program test voltage being incremented gradually, the program test voltage will finally be raised to a level similar to the real value of the threshold voltage of the floating gate transistor 110 currently. In some embodiments, the program test voltage that is able to induce enough read current during the program verification can be recorded as the current value of the threshold voltage of the floating gate transistor 110, and will be used by the next program searching operation as the previous value of the threshold voltage.

Furthermore, since the program test voltage is updated gradually with a fixed step voltage, the number of program verifications being performed during the program searching operation should be related to the variation of the threshold voltage. That is, if the threshold voltage has been raised significantly, the number of program verifications being performed during the program searching operation should be rather large so that the program test voltage can reach to the similar level of the threshold voltage. However, if the threshold voltage has not been raised significantly, that is, if the variation of the threshold voltage is rather small, then the number of program verifications being performed during the program searching would be rather small.

Therefore, in some embodiments, the number of program verifications being performed during the program searching operation can be used to represent the variation of threshold voltage in sub-step S235 when the current value of the threshold voltage is found.

In FIG. 3, the threshold voltage has been raised to the value VT1 after the first program voltage VP1 is applied. However, since the value VT1 is smaller than the target value VTP, step S250 will be performed as suggested by step S240.

In step S250, the variation of the threshold voltage recorded in step S230 can be used to update the program voltage to be used in step S260. For example, if the first program voltage VP1 applied to the control line CL is chosen properly, the FN tunneling effect can be induced significantly, and the threshold voltage of the floating gate transistor 110 will also be raised significantly. In this case, the updated program voltage VP2 to be used can have a similar level as the first program voltage VP1, or can be slightly greater than the first program voltage VP1. However, if the first program voltage VP1 is not high enough and the threshold voltage is not raised significantly, the updated program voltage VP2 to be used may be set to be much greater than the first program voltage VP1.

Once the updated program voltage VP2 is generated, the floating gate of the floating gate transistor 110 can be coupled to the updated program voltage VP2 in step S260, and step S230 will be performed again to identify the variation of the threshold voltage. That is, the program searching operation can be performed every time after the program voltage is applied to check the programming state of the floating gate transistor 110 and update the program voltage to be used next.

Table 1 shows the step voltages to be added to or deducted from the previous program voltage when generating the update program voltage in step S250.

TABLE 1

| Variation of threshold voltage | N < X | X ≤ N < Y | Y ≤ N < Z | Z ≤ N |
|---|---|---|---|---|
| Step voltage | +ΔV1 | +ΔV2 | 0 | −ΔV3 |
| duration | P1 | P2 | P3 | P4 |

In table 1, the variation of the threshold voltage can be represented by the number N of the program verifications performed in step S230 aforementioned. Furthermore, if the number N is smaller than a first threshold number X, the second program voltage VP2 would be generated by incrementing a first step voltage ΔV1 to the first program voltage VP1. Also, if the number N is greater than or equal to the first threshold number X, and is smaller than a second threshold number Y, the second program voltage VP2 can be generated by incrementing a second step voltage ΔV2 to the first program voltage VP1, and the first step voltage ΔV1 can be greater than the second step voltage ΔV2. For example, but not limited to, the number X can be 3, the number Y can be 7, the first step voltage ΔV1 can be 1V and the second step voltage ΔV2 can be 0.5V.

That is, when the variation of the threshold voltage is smaller than the first threshold number X, it may imply that the program voltage used previously is not high enough to induce the FN tunneling effectively. Therefore, the program voltage to be used next should be updated to have a higher level so the first step voltage ΔV1 will be added to the previous program voltage to generate the updated program voltage. For example, in FIG. 3, since the variation of the threshold voltage is quite small after the first program voltage VP1 is applied, the second program voltage VP2 can be generated by adding the first step voltage ΔV1 to the first program voltage VP1.

However, when the variation of the threshold voltage is greater than or equal to the first threshold number X, it may imply that the program voltage used previously is quite effective and may only need a slight adjustment. In this case, the second step voltage ΔV2 smaller than the first step voltage ΔV1 will be added to the previous program voltage to generate the updated program voltage. For example, in FIG. 3, the third program voltage VP3 can be generated by adding the second step voltage ΔV2 to the second program voltage VP2.

Furthermore, in table 1, if the number N is greater than or equal to the second threshold number Y, and is smaller than a third threshold number Z, it may imply that the previous program voltage is very effective, and it may be preferred to use the previous program voltage as the updated program voltage in the next operation. For example, in FIG. 3, the fourth program voltage VP4 may have the same voltage level as the third program voltage VP3.

However, if the number N is greater than or equal to the third threshold number Z, it may imply that the previous program voltage is too high and the floating gate transistor 110 may be damaged. In this case, the updated program voltage can be generated by deducting the third step voltage ΔV3 from the previous program voltage. For example, in FIG. 3, the fifth program voltage VP5 can be generated by deducting the third step voltage ΔV3 from the previous program voltage. In some embodiments, for example, but not limited to, the number Z can be 12, the third step voltage ΔV3 can be 0.5V.

In FIG. 3, after the fifth program voltage VP5 is applied, the value VT2 of the threshold voltage of the floating gate transistor 110 finally reaches the predetermined level VTP, for example but not limited to 3V, the program operation is completed as suggested in steps S240 and S270.

In addition, in FIG. 3, the program voltages VP1 to VP5 may be applied for time periods of different lengths. In some embodiments, the length of the period that the program voltage should be applied can also be determined according to the variation of the threshold voltage obtained in the program searching operation.

For example, the length of the period for the next program voltage can be determined according to the durations suggested in table 1. That is, as the first step voltage ΔV1 is used to generate the second program voltage VP2, the second program voltage VP2 may be applied for the period P1 in FIG. 3. Also, as the second step voltage ΔV2 is used to generate the third program voltage VP3, the third program voltage VP3 may be applied for the period P2. As the program voltage VP4 has the same level as the program voltage VP3, the fourth program voltage VP4 may be applied for the period P3 in the next operation. In addition, when the third step voltage ΔV3 is used to generate the fifth program voltage VP5, the fifth program voltage VP5 may be applied for the period P4.

In some embodiments, since the first step voltage ΔV1 may be rather large, the length of the period P1 may be set smaller, so the floating gate transistor 110 can be protected from being damaged by the increased program voltage. Therefore, the length of the period P1 may be shorter than the length of the period P2 and the length of the period P4. Furthermore, when the updated program voltage has the same level as the previous program voltage, it may imply the program voltage is quite effective so the length of the period P3 can be longer. Therefore, the length of the period P3 can be longer than the length of the period P2 and the length of the period P4.

With the method 200, the non-volatile memory cell 100 can be programmed by updating the program voltages adaptively according to the programming states. Therefore, the program operation can be performed efficiently and safely.

Figure 6:
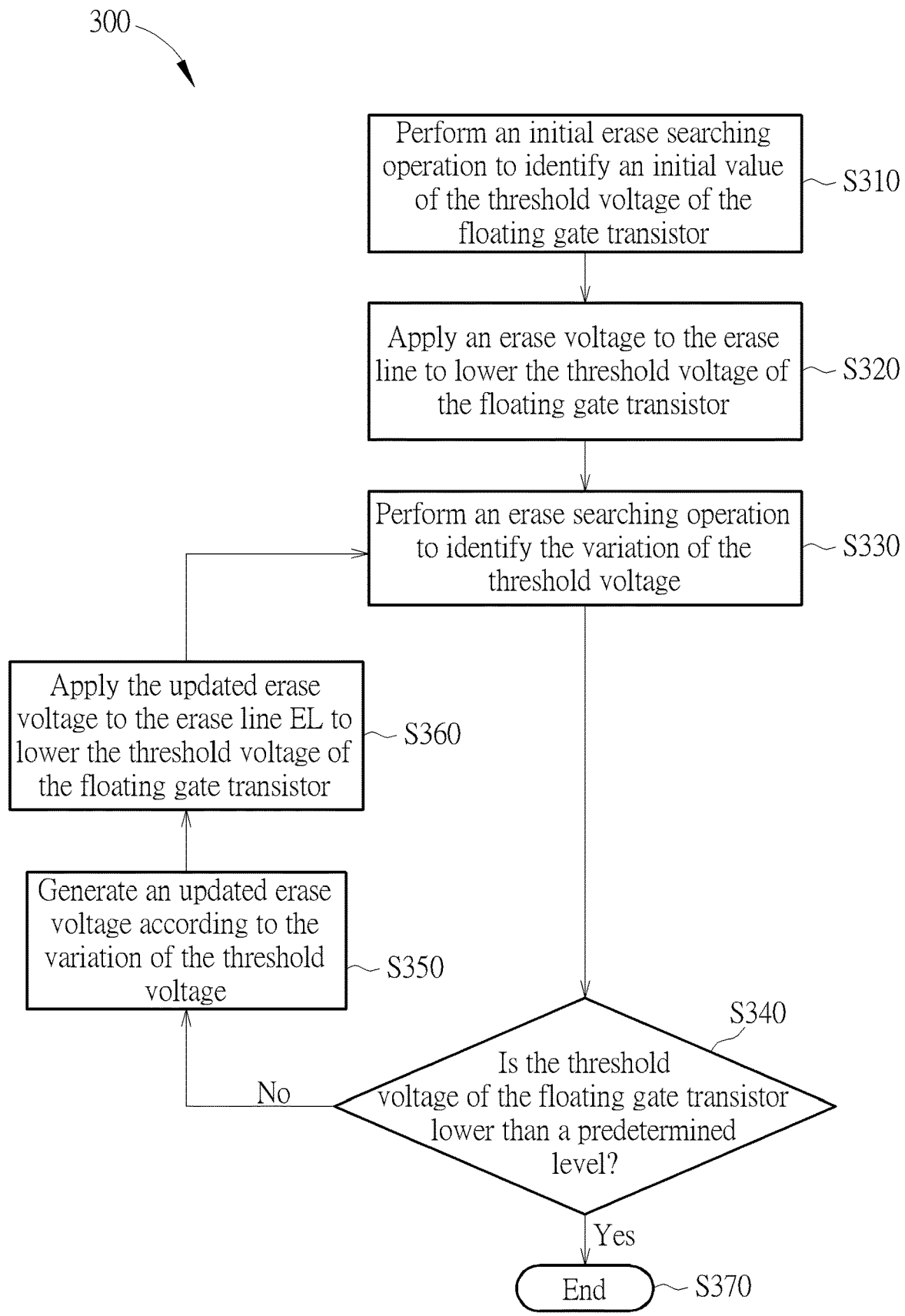
FIG. 6 shows a method for operating the non-volatile memory cell in FIG. 1 according to another embodiment of the present invention.

In some embodiments, the similar principles can be used for erase operation. FIG. 6 shows a method 300 for operating the non-volatile memory cell 100 according to one embodiment of the present invention. The method 300 can be used for performing the erase operation. The method 300 includes steps S310 to S370.

S310: perform an initial erase searching operation to identify an initial value of the threshold voltage of the floating gate transistor 110;

S320: apply an erase voltage to the erase line EL to lower the threshold voltage of the floating gate transistor;

S330: perform an erase searching operation to identify the variation of the threshold voltage;

S340: if the threshold voltage of the floating gate transistor 110 is lower than a predetermined level, go to S370, else go to S350;

S350: generate an updated erase voltage according to the variation of the threshold voltage;

S360: apply the updated erase voltage to the erase line EL to lower the threshold voltage of the floating gate transistor 110, go to step S330; and S370: End.

In method 300, the erase operation can be mainly performed by applying the erase voltages to the erase line EL in step S320 and S360 so that the electrons captured in the floating gate of the floating gate transistor 110 can be ejected through the erase element 130. However, to find the suitable erase voltages, the method 300 can also perform the erase searching operations to identify the variation of the threshold voltage in step S330 and generate the updated erase voltage according to the variation of the threshold voltage in step S350. As the electron being ejected from the floating gate, the threshold voltage of the floating gate transistor 110 will be lowered, and finally when the threshold voltage of the floating gate transistor 110 is lower than a predetermined level, the non-volatile memory cell 100 will be determined to be erased.

Figure 7:
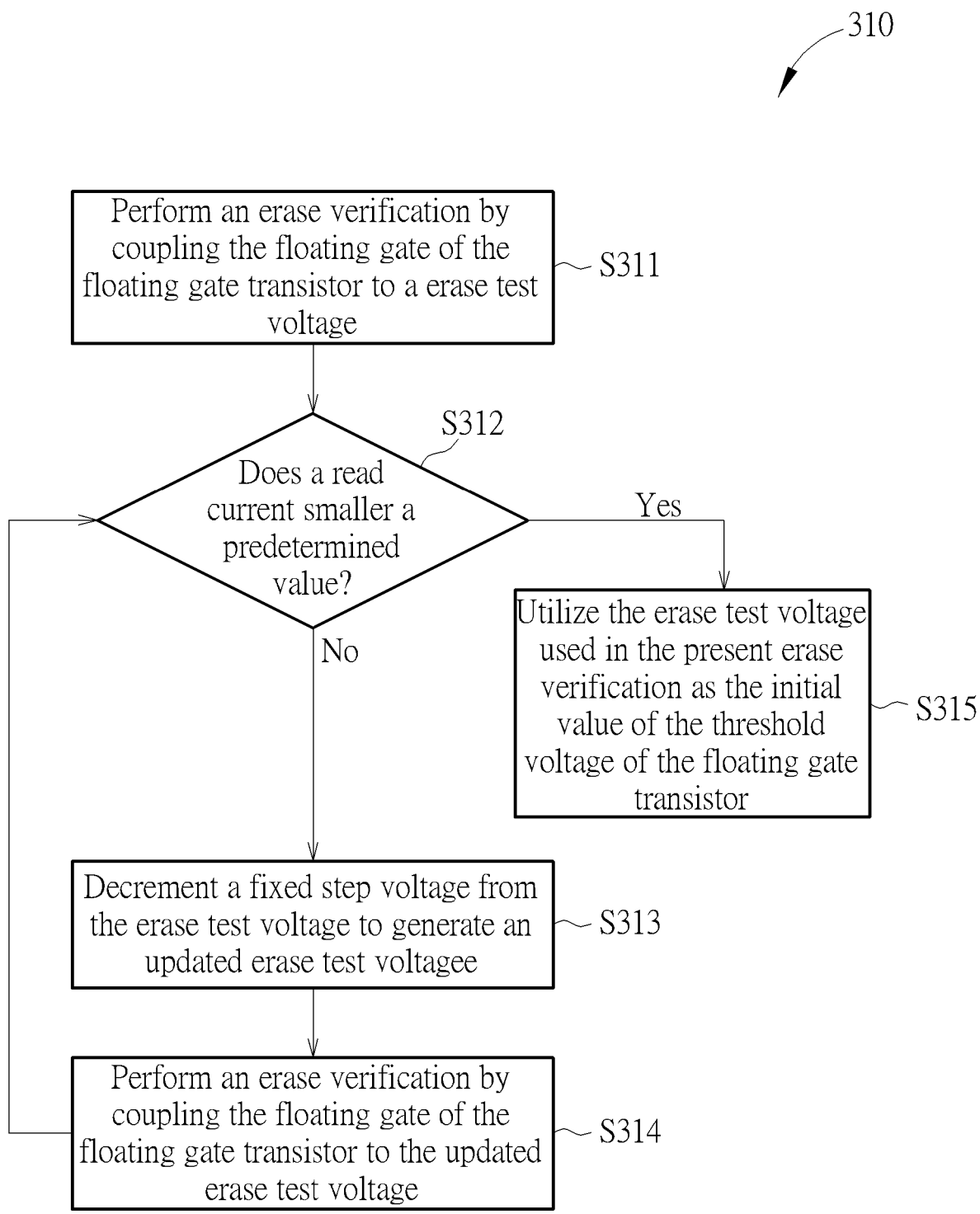
FIG. 7 shows the sub-steps of the initial erase searching operation according to one embodiment of the present invention.

In some embodiments, the initial erase searching operation can follow the similar principles of the initial program searching operation. FIG. 7 shows sub-steps S311 to S315 of step S310 according to one embodiment of the present invention.

S311: perform an erase verification by coupling the floating gate of the floating gate transistor 110 to a erase test voltage;

S312: if a read current is smaller a predetermined value, go to sub-step S315, else go to sub-step S313;

S313: decrement a fixed step voltage from the erase test voltage to generate an updated erase test voltage;

S314: perform an erase verification by coupling the floating gate of the floating gate transistor 110 to the updated erase test voltage, go to sub-step S312; and S315: utilize the erase test voltage used in the present erase verification as the initial value of the threshold voltage of the floating gate transistor 110.

During sub-steps S311 to S315, the erase test voltage will be decreased gradually until the reading current becomes smaller than the predetermined value, and the highest erase test voltage that is able to turn off the floating gate transistor 110 during the initial erase searching operation can be recorded as the initial value of the threshold voltage of the floating gate transistor 110 for the erase operation.

Figure 8:
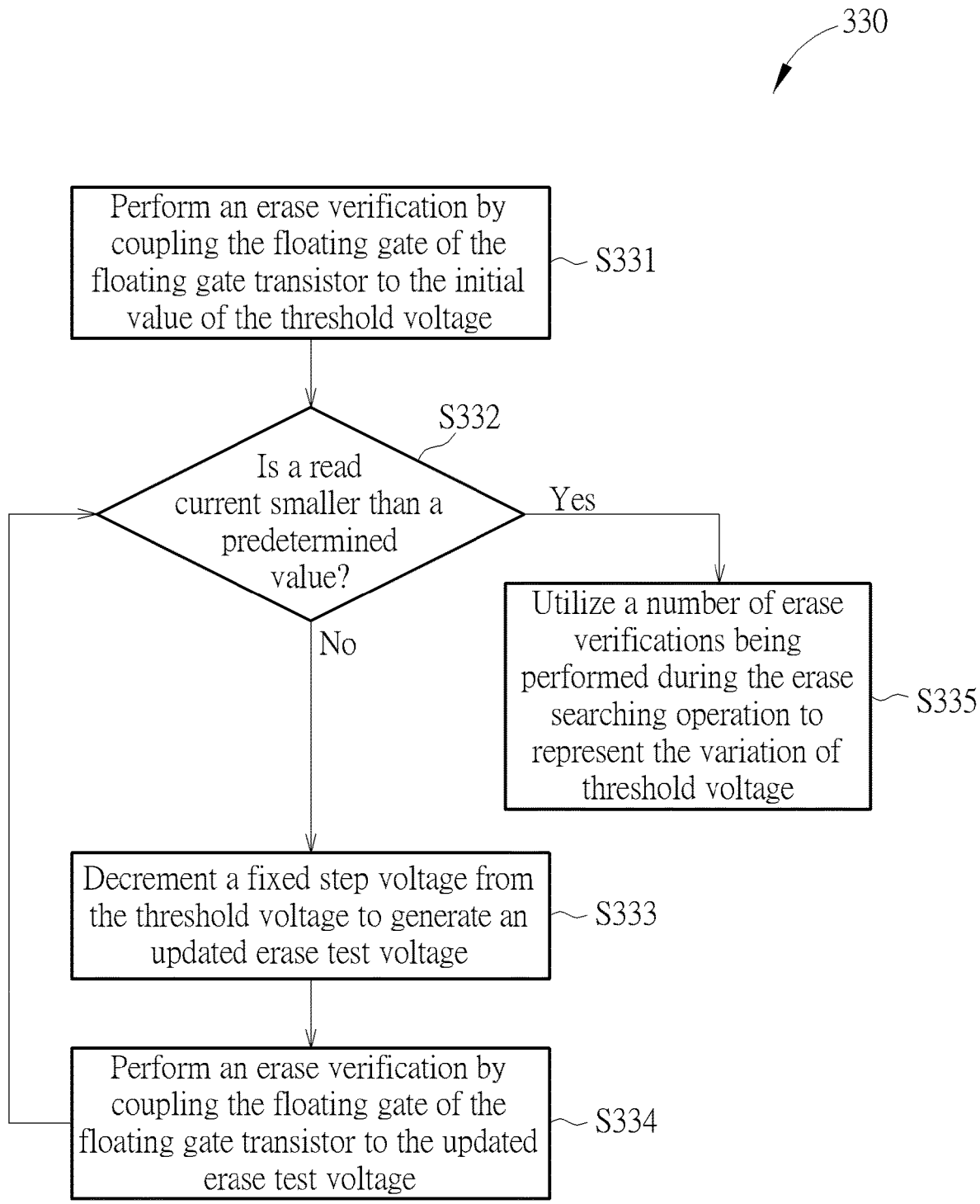
FIG. 8 shows the sub-steps of the erase searching operation according to one embodiment of the present invention.

In some embodiments, the erase searching operation can also follow the similar principles of the program searching operation. FIG. 8 shows sub-steps S331 to S335 of step S330 according to one embodiment of the present invention.

S331: perform an erase verification by coupling the floating gate of the floating gate transistor 110 to the initial value of the threshold voltage;

S332: if a read current is smaller than a predetermined value, go to sub-step S335, else go to sub-step S333;

S333: decrement a fixed step voltage from the threshold voltage to generate an updated erase test voltage;

S334: perform an erase verification by coupling the floating gate of the floating gate transistor 110 to the updated erase test voltage, go to sub-step S332;

S335: utilize a number of erase verifications being performed during the erase searching operation to represent the variation of threshold voltage.

In step S350, the variation of the threshold voltage recorded in step S330 can be used to update the erase voltage to be used in step S360. For example, if the first erase voltage applied to the erase line EL is chosen properly, the threshold voltage of the floating gate transistor 110 should be lowered significantly. In this case, the second erase voltage to be used may have a similar level as the first erase voltage, or can be slightly greater than the first erase voltage VP1. However, if the first erase voltage is not high enough and the threshold voltage is not lowered significantly, the updated erase voltage to be used may be set to be much greater than the first erase voltage.

In some embodiments, the erase voltages can be updated according to table 1 as the program voltages. However, in some other embodiments, the erase voltages can also be updated based on other rules according to the variation of the threshold voltage of the floating gate transistor 110.

Once the updated erase voltage is generated, the floating gate of the floating gate transistor 110 can be coupled to the updated erase voltage in step S360, and step S330 will be performed again to identify the variation of the threshold voltage. That is, the erase searching operation can be performed every time after the erase voltage is applied to check the erasing state of the floating gate transistor 110 and update the erase voltage to be used next.

With the method 300, the non-volatile memory cell 100 can be erased by updating the erase voltages adaptively according to the erasing states. Therefore, the erase operation can be performed efficiently and safely.

In summary, the method for operating non-volatile memory cells provided by the embodiments of the present invention can program and/or erase the non-volatile memory cells by updating the operation voltages according to the variation of the threshold voltage of the floating gate transistor. Therefore, the operation voltages used for programming and erasing can be effective, thereby improving the efficiency and the safety of the program operation and the erase operation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for operating a non-volatile memory cell, the non-volatile memory cell comprising a floating gate transistor having a floating gate, and the method comprising:
   during a program operation:
      performing an initial program searching operation to identify a first initial value of a threshold voltage of the floating gate transistor;
      coupling the floating gate of the floating gate transistor to a first program voltage to raise the threshold voltage of the floating gate transistor;
      performing a program searching operation to identify a first variation of the threshold voltage;
      generating a second program voltage according to the first variation of the threshold voltage; and
      coupling the floating gate of the floating gate transistor to the second program voltage to raise the threshold voltage of the floating gate transistor.

2. The method of claim 1, wherein performing the initial program searching operation to identify the first initial value of the threshold voltage of the floating gate transistor comprises:
   performing a program verification by coupling the floating gate of the floating gate transistor to an initial program test voltage;
   when a read current is smaller than a predetermined value:
      incrementing a fixed step voltage to the initial program test voltage to generate a first program test voltage; and
      performing another program verification by coupling the floating gate of the floating gate transistor to the first program test voltage; and
   when a read current exceeds the predetermined value, utilizing a program test voltage used in a present program verification as the first initial value of the threshold voltage of the floating gate transistor.

3. The method of claim 1, wherein performing the program searching operation to identify the first variation of the threshold voltage comprises:
   performing a program verification by coupling the floating gate of the floating gate transistor to the first initial value of the threshold voltage;
   when a read current is smaller than a predetermined value:
      incrementing a fixed step voltage to the first initial value of the threshold voltage to generate a second program test voltage; and
      performing another program verification by coupling the floating gate of the floating gate transistor to the second program test voltage; and
   when a read current exceeds the predetermined value, utilizing a number of program verifications being performed during the program searching operation to represent the first variation of threshold voltage.

4. The method of claim 3, wherein generating the second program voltage according to the first variation of the threshold voltage comprises:
   when the number of program verifications being performed during the program searching operation is smaller than a first threshold number, incrementing a first step voltage to the first program voltage to generate the second program voltage; and
   when the number of program verifications being performed during the program searching operation is greater than or equal to the first threshold number, and is smaller than a second threshold number, incrementing a second step voltage to the first program voltage to generate the second program voltage;

wherein the first step voltage is greater than the second step voltage.

5. The method of claim 4, wherein generating the second program voltage according to the first variation of the threshold voltage further comprises:
when the number of program verifications being performed during the program searching operation is greater than or equal to the second threshold number, and is smaller than a third threshold number, utilizing the first program voltage as the second program voltage; and
when the number of program verifications being performed during the program searching operation is greater than or equal to the third threshold number, decrementing a third step voltage from the first program voltage to generate the second program voltage.

6. The method of claim 1, further comprising during the program operation:
determining a length of a first period according to the first variation of the threshold voltage;
wherein the floating gate of the floating gate transistor is coupled to the second program voltage for the first period.

7. The method of claim 1, wherein the program operation is completed when the threshold voltage of the floating gate transistor is raised to a predetermined level.

8. The method of claim 1, wherein the non-volatile memory cell further comprises an erase element having a first terminal coupled to the floating gate of the floating gate transistor and a second terminal coupled to an erase line, and the method further comprises:
during an erase operation:
performing an initial erase searching operation to identify a second initial value of the threshold voltage of the floating gate transistor;
applying a first erase voltage to the erase line to lower the threshold voltage of the floating gate transistor;
performing an erase searching operation to identify a second variation of the threshold voltage;
generating a second erase voltage according to the second variation of the threshold voltage; and
applying the second erase voltage to the erase line to lower the threshold voltage of the floating gate transistor;
wherein the erase operation is completed when the threshold voltage of the floating gate transistor is lowered to a predetermined level.

9. The method of claim 8, wherein performing the initial erase searching operation to identify the second initial value of the threshold voltage of the floating gate transistor comprises:
performing an erase verification by coupling the floating gate of the floating gate transistor to an initial erase test voltage;
when a read current exceeds a predetermined value:
decrementing a fixed step voltage from the initial erase test voltage to generate a first erase test voltage; and
performing another erase verification by coupling the floating gate of the floating gate transistor to the first erase test voltage; and
when a read current is smaller than the predetermined value, utilizing an erase test voltage used in a present erase verification as the second initial value of the threshold voltage of the floating gate transistor.

10. The method of claim 8, wherein performing the erase searching operation to identify the second variation of the threshold voltage comprises:

performing an erase verification by coupling the floating gate of the floating gate transistor to the second initial value of the threshold voltage;
when a read current exceeds a predetermined value:
decrementing a fixed step voltage from the second initial value of the threshold voltage to generate a second erase test voltage; and
performing another erase verification by coupling the floating gate of the floating gate transistor to the second erase test voltage; and
when a read current is smaller than the predetermined value, utilizing a number of erase verifications being performed during the erase searching operation to represent the second variation of threshold voltage.

11. The method of claim 10, wherein generating the second erase voltage according to the second variation of the threshold voltage comprises:
when the number of erase verifications being performed during the erase searching operation is smaller than a first threshold number, incrementing a first step voltage to the first erase voltage to generate the second erase voltage; and
when the number of erase verifications being performed during the erase searching operation is greater than or equal to the first threshold number, and is smaller than a second threshold number, incrementing a second step voltage to the first erase voltage to generate the second erase voltage;
wherein the first step voltage is greater than the second step voltage.

12. The method of claim 11, wherein generating the second erase voltage according to the second variation of the threshold voltage further comprises:
when the number of erase verifications being performed during the erase searching operation is greater than or equal to the second threshold number, and is smaller than a third threshold number, utilizing the first erase voltage as the second erase voltage; and
when the number of erase verifications being performed during the erase searching operation is greater than or equal to the third threshold number, decrementing a third step voltage from the first erase voltage to generate the second erase voltage.

13. The method of claim 8, further comprising during the erase operation:
determining a length of a second period according to the second variation of the threshold voltage;
wherein the second erase voltage is applied to the erase line for the second period.

14. The method of claim 8, wherein the non-volatile memory cell further comprises:
a control element having a first terminal coupled to the floating gate of the floating gate transistor, and a second terminal coupled to a control line;
an erase element having a first terminal coupled to the floating gate of the floating gate transistor, and a second terminal coupled to an erase line;
a select transistor having a first terminal coupled to a source line, a second terminal coupled to a first terminal of the floating gate transistor, and a control terminal coupled to a select gate line; and
a word transistor having a first terminal coupled to a bit line, a second terminal coupled to a second terminal of the floating gate transistor, and a control terminal coupled to a word line.

* * * * *